United States Patent
Schwarzmueller

(10) Patent No.: US 8,630,603 B2
(45) Date of Patent: Jan. 14, 2014

(54) CIRCUIT AND METHOD FOR IMAGE FREQUENCY REJECTION

(75) Inventor: Marco Schwarzmueller, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 482 days.

(21) Appl. No.: 12/716,816

(22) Filed: Mar. 3, 2010

(65) Prior Publication Data

US 2010/0227580 A1    Sep. 9, 2010

Related U.S. Application Data

(60) Provisional application No. 61/157,988, filed on Mar. 6, 2009.

(30) Foreign Application Priority Data

Mar. 6, 2009 (DE) .......................... 10 2009 011 549

(51) Int. Cl.
   *H04B 1/10* (2006.01)
(52) U.S. Cl.
   USPC ............................. 455/302; 455/307; 455/333
(58) Field of Classification Search
   USPC ............. 455/63.1, 67.13, 295, 296, 302, 307, 455/333, 334; 375/340, 346
   See application file for complete search history.

(56) References Cited

U.S. PATENT DOCUMENTS

| | | | |
|---|---|---|---|
| 4,605,822 A * | 8/1986 | Amstutz et al. | 370/288 |
| 7,043,221 B2 * | 5/2006 | Jovenin et al. | 455/302 |
| 7,369,835 B2 * | 5/2008 | Margairaz et al. | 455/302 |
| 7,450,185 B2 * | 11/2008 | Wu | 348/725 |
| 7,925,238 B2 * | 4/2011 | Suominen | 455/302 |
| 2007/0093228 A1 | 4/2007 | Bayruns | |

OTHER PUBLICATIONS

German Patent and Trademark Office, Office Action and English Translation of Official Communication, Appl. No. 10 2009 011 549. 8-35, Request for Examination, Jan. 24, 2011.
F. Behbahani, Y. Kishigami, J. Leete, A. Abidi, IEEE Journal of Solid-State Circuits, vol. 36, No. 6, Jun. 2001, *CMOS Mixers and Polyphase Filters for Large Image Rejection* (15 pgs).
F. Behbahani, J. Leete, Y. Kishigami, A. Roithmeier, K. Hoshino, A. Abidi, IEEE Journal of Solid-State Circuits, vol. 35, No. 12, Dec. 2000, *A 2.4-GHz Low-IF Receiver for Wideband WLAN in 0.6-μm CMOS—Architecture and Front-End* (9 pages).
German title: Netz Formeln der Elektrotechnik und Elektronik; English title: Formulas of the electrical engineering and electronics/ Network, Möschwitzer, Albrecht (publisher): Formeln der Elektrotechnik. München, Wien: Hanser 1986, p. 137, ISBN-3-446-14253.

* cited by examiner

*Primary Examiner* — Quochien B Vuong
(74) *Attorney, Agent, or Firm* — Baker Botts LLP

(57) ABSTRACT

A circuit and method for image frequency rejection is provided that includes an analog dual-quadrature mixer device whose signal inputs for an in-phase-signal and a quadrature-phase signal are connected to an input circuit in the signal path and whose oscillator inputs for an in-phase oscillator signal and a quadrature-phase oscillator signal are connected to a local oscillator device, having an analog adder-amplifier device, which has a number of transistor pairs, in which in each case both transistors of each transistor pair are connected to the same load resistor for the addition of the signals applied at the control inputs of both transistors, and in which the control inputs of both transistors are connected downstream of the outputs of analog dual-quadrature mixer device, and having a multistage analog polyphase filter whose inputs are connected to outputs of the adder-amplifier device.

17 Claims, 4 Drawing Sheets

CIRCUIT AND METHOD FOR IMAGE FREQUENCY REJECTION

This nonprovisional application claims priority to German Patent Application No. 10 2009 011549.8, which was filed in Germany on Mar. 6, 2009, and to U.S. Provisional Application No. 61/157,988, which was filed on Mar. 6, 2009, and which are both herein incorporated by reference.

BACKGROUND OF THE INVENTION

1. Field of the Invention

The present invention relates to a circuit and a method for image frequency rejection.

2. Description of the Background Art

At present, there is a trend to carry out signal processing in the baseband by means of a digital signal processor. In narrow-band systems, several channels can be digitized by an analog-to-digital converter and the desired channel can be selected in the digital signal processor. In broad-band systems, the analog part of the receiver must be able to process the dynamic range of the analog signal. To this end, analog circuits are needed for image frequency signal rejection and frequency conversion.

Receiving systems with circuits according to FIG. 1a, FIG. 1b, and FIG. 1c are known from "A 2.4-GHz Low-IF Receiver for Wideband WLAN in 0.6 um CMOS-Architecture and Front-End," Abidi et al., IEEE JOURNAL OF SOLID-STATE CIRCUITS, Vol. 35, No. 12, December 2000 and from "CMOS Mixers and Polyphase Filters for Large Image Rejection," Abidi et al., IEEE JOURNAL OF SOLID-STATE CIRCUITS, Vol. 36, No. 6, June 2001. A front-end circuit for downmixing for a 2.4 GHz signal integrated into a receiver with a low intermediate frequency is also known. For dual frequency conversion, the analog receiver rejects the image frequency signal by 60 dB. FIG. 1a shows a fully integrated dual frequency-converting superheterodyne receiver with on-chip circuits for image frequency signal rejection. The circuit shows a dual conversion receiver with a low intermediate frequency (low IF). Input circuit 700 has an amplifier 702 (LNA, Low Noise Amplifier) with bandpass filter 701 and a quadrature mixer 710, whereby the quadrature mixer 710 for downmixing is connected to a polyphase filter 810 for generating an in-phase signal and a quadrature-phase signal from the first oscillator signal LO1. A dual polyphase filter 730 partially rejects the image frequency signal. Two amplifiers 711, 712 of an amplification device 710 are connected upstream of the dual polyphase filter 730.

The intermediate frequency mixer 300 converts the first intermediate frequency at its input into a low second intermediate frequency. In each case, five polyphase filters 111, 611 to 614 are connected downstream of four of the eight outputs of intermediate frequency mixer 300 in each case and polyphase filters 112, 621 to 624 of filter units 100, 600 are connected downstream of the other four outputs. Amplifiers 901, 902, 903, 904 of amplifier device 900 between polyphase filters 100 and 600 compensate for losses of about 10 dB in polyphase filters 100, 600. A programmable amplifier and an analog-to-digital converter can be connected downstream of polyphase filters 600 (not shown in FIG. 1).

A single-stage polyphase filter 611 used in the superheterodyne receiver is shown in FIG. 1b. Polyphase filter 611 has four resistors and four capacitors for phase shifting. A possible dimensioning of the resistors and capacitors is also given in the aforementioned publication.

Analog mixer 300, which downmixes the first intermediate frequency signal to the second intermediate frequency signal with a lower intermediate frequency, is formed as a dual-quadrature mixer 300. Dual-quadrature mixer 300 has four inputs for the differential in-phase component and the differential quadrature-phase component of the first intermediate frequency signal, which are multiplied by means of the dual-quadrature mixer 300 with an in-phase component $I_{LO}$ and a quadrature-phase component $Q_{LO}$ of the oscillator signal LO2.

Because of the high requirements for pairing of the individual mixers for the image frequency signal rejection of 60 dB, the analog dual-quadrature mixer 300 is realized not by a Gilbert cell but by passive mixer 301 with four field-effect transistors in each case. A passive mixer 301 is shown schematically in FIG. 1c. Well-paired resistors of a resistor network 740 are used to adjust the amplification of passive mixers 301 of the dual-quadrature mixer 300 to one another.

SUMMARY OF THE INVENTION

It is therefore an object of the invention to provide a circuit for image frequency rejection as much as possible. The circuit can be integrated monolithically on a semiconductor chip. The circuit can have an analog dual-quadrature mixer device. The mixer device can be a dual-quadrature mixer device, whereby an in-phase signal and a quadrature-phase signal are multiplied at the input of the mixer device by an in-phase oscillator signal and a quadrature-phase oscillator signal.

Signal inputs of the dual-quadrature mixer device for the in-phase signal and the quadrature-phase signal are connectable to an input circuit in the signal path. The input circuit can have analog subcircuits for receiving a signal, particularly a radio signal.

Oscillator inputs of the dual-quadrature mixer device for an in-phase oscillator signal and a quadrature-phase oscillator signal can be connected to a local oscillator device (LO, local oscillator).

The circuit can have an analog adder-amplifier device, which is formed for amplification and addition. The adder-amplifier device has a number of transistor pairs. In each case, both transistors of each transistor pair are connected to the same load for addition of the signals applied at the control inputs of both transistors. Therefore, a current controlled by both transistors of a transistor pair flows through the load. The control inputs of both transistors, for example, the gate electrodes of field-effect transistors, are connected downstream of the outputs of the analog dual-quadrature mixer device in the signal path. It is possible in this regard to connect a polyphase filter between the analog dual-quadrature mixer device and the analog adder-amplifier device.

The circuit can have a multistage analog polyphase filter whose inputs are connected to the outputs of the adder-amplifier device.

The object of the invention further is to provide a method for image frequency rejection as improved as possible. In the method, in an analog dual-quadrature mixer device an in-phase signal and a quadrature-phase signal are downmixed or upmixed to output signals by means of an in-phase oscillator signal and a quadrature-phase oscillator signal of a local oscillator device.

In each case, two of the signals can be added and amplified into sum signals by means of an adder-amplifier device.

The sum signals can be filtered by a multistage analog polyphase filter.

In an embodiment, the load is formed by passive components. Such passive components are, for example, resistors or inductors. According to another embodiment variant, the load is formed by components of the multistage analog polyphase filter itself.

In another embodiment, the load can be formed by active components. For example, the load may be formed by a current source or a current drain.

According to another embodiment, the active load can be formed from two complementary transistors. A transistor of the transistor pair and a complementary transistor in this regard together form a push-pull stage.

According to an embodiment, the circuit can have another analog polyphase filter, which is connected to the outputs of the analog dual-quadrature mixer device and to the inputs of the analog adder-amplifier device. Transistors of the adder-amplifier device can be connected to different outputs of the additional analog polyphase filter.

In a further embodiment, the polyphase filter and/or the additional polyphase filter and/or the dual-quadrature mixer device and/or the adder-amplifier device can be formed differentially.

The dual-quadrature mixer device can have passive mixers. The passive mixers can be formed by four field-effect transistors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1A:
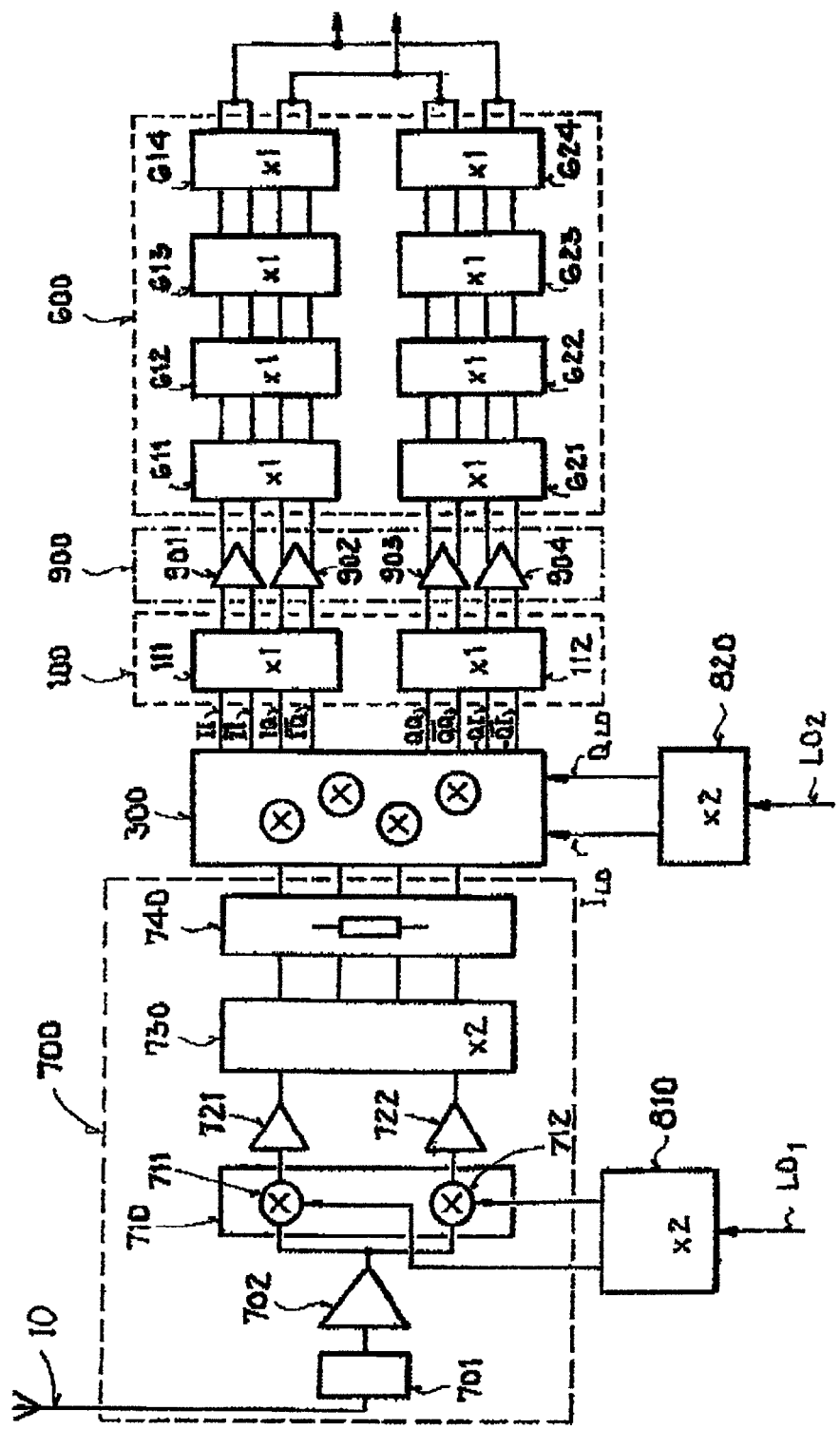
FIG. 1a shows a receiver system of the state of the art.
Figure 1B:
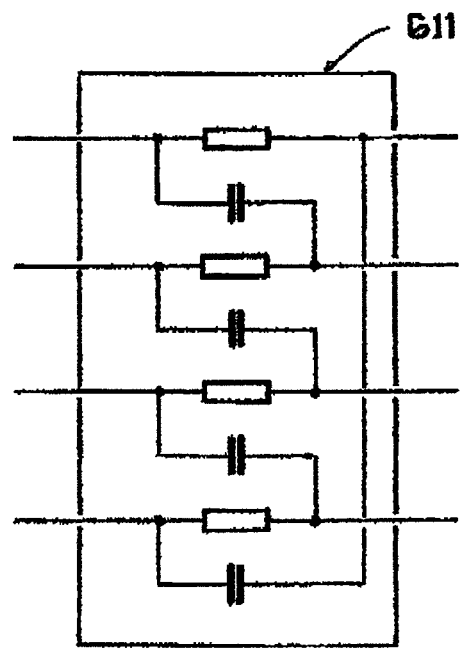
FIG. 1b shows a polyphase filter.
Figure 1C:
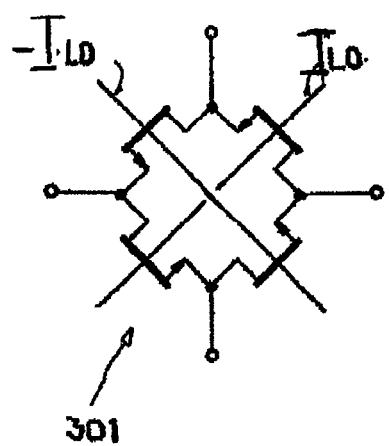
FIG. 1c shows a passive mixer.
Figure 2:
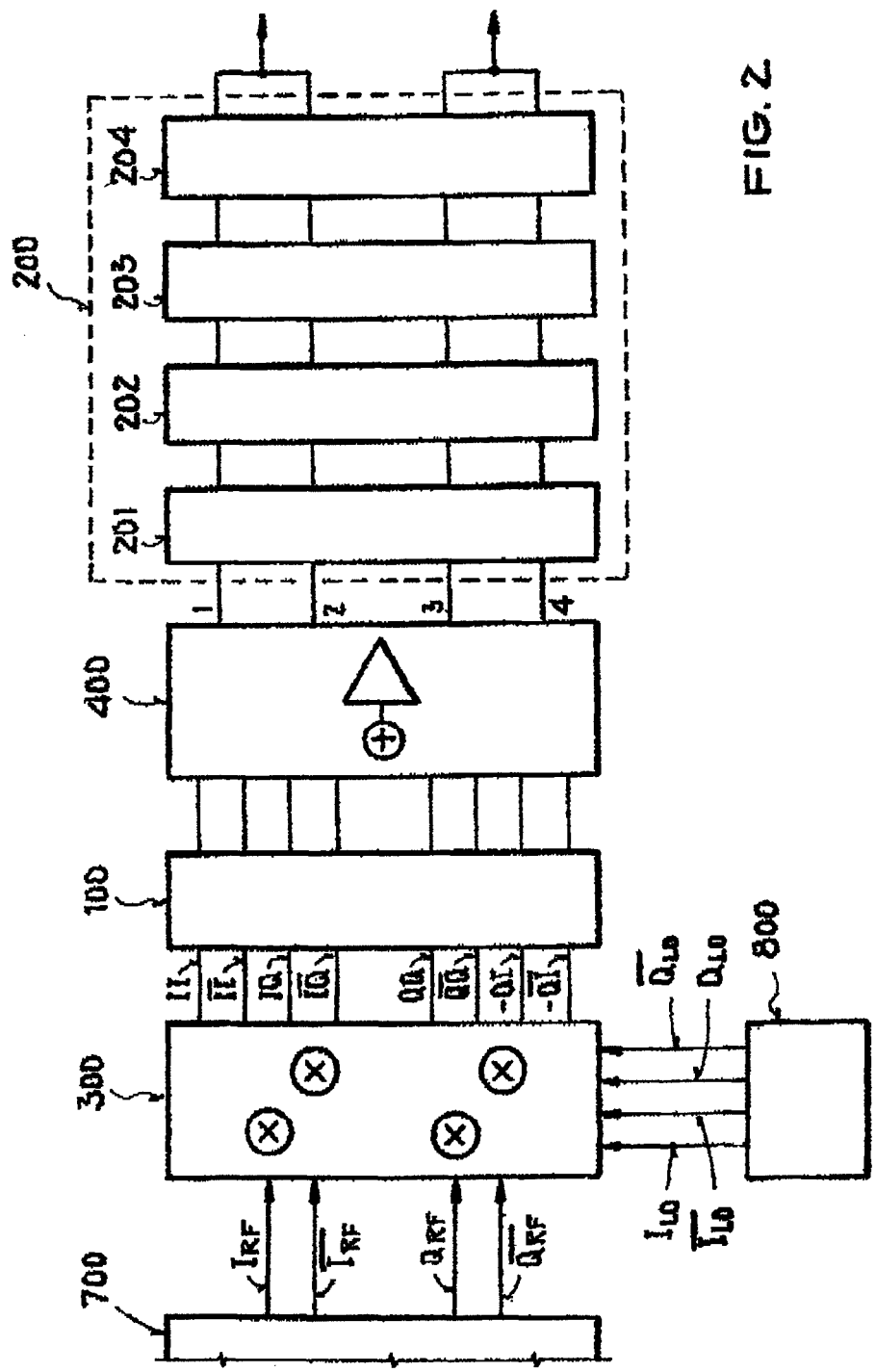
FIG. 2 shows a schematic block diagram of a receiver circuit.

A receiver circuit is shown schematically in FIG. 2 by a block diagram. The circuit according to FIG. 2 is formed for image frequency rejection. The circuit shows an input circuit 700 (not defined in greater detail), which may be formed, for example, according to input circuit 700 of FIG. 1. Input circuit 700 outputs a differential in-phase signal $I_{IF}$ and $-I_{IF}$ and a differential quadrature-phase signal $Q_{IF}$ and $-Q_{IF}$. These are preferably parts of a first intermediate frequency signal.

The circuit has an analog dual-quadrature mixer device 300. The signal inputs of the dual-quadrature mixer device 300 for the in-phase signal $I_{IF}$ and the quadrature-phase signal $Q_{IF}$ are connected to input circuit 700 in the signal path.

Dual-quadrature mixer device 300 has oscillator inputs, which for a differential in-phase oscillator signal $I_{LO}$ and $-I_{LO}$ and a differential quadrature-phase oscillator signal $Q_{LO}$ and $-Q_{LO}$ are connected to a local oscillator device 800 (local oscillator). The four output signals $I_{LO}$, $Q_{LO}$, $-Q_{LO}$ are phase-shifted by 90° relative to one another. Dual-quadrature mixer device 300 has four so-called passive mixers, as is shown by way of example, for instance, in FIG. 1c. These passive mixers 301 each have four field-effect transistors, which are connected as a switch.

The eight signals II, –II, QQ, –QQ, IQ, –QI, –IQ, QI are output by the mixing process of the analog dual-quadrature mixer device 300 at the output of analog dual-quadrature mixer device 300. In this regard, the first letter indicates the oscillator signal $I_{LO}$, $-I_{LO}$, $Q_{LO}$, $-Q_{LO}$ of local oscillator device 800 and the second letter indicates the in-phase signal $I_{IF}$, $-I_{IF}$ and the quadrature-phase signal $Q_{IF}$, $-Q_{IF}$ at the input of analog dual-quadrature mixer device 300, which are multiplied by one another.

The circuit has an analog adder-amplifier device 400, which is connected downstream of analog dual-quadrature mixer device 300 in the signal path. A multistage polyphase filter 200 is connected to the outputs of analog adder-amplifier device 400. Polyphase filter 200 in the exemplary embodiment of FIG. 2 has four stages 201, 201, 203, 204, which may be formed, for example, according to FIG. 1b. Another polyphase filter 100, which depending on the application may also be omitted or formed in a multistage manner, is connected between the analog dual-quadrature mixer device 300 and the analog adder-amplifier device 400 in the exemplary embodiment of FIG. 2.

Analog adder-amplifier device 400 amplifies and adds together in each case two of the signals II, –II, QQ, –QQ, IQ, –QI, –IQ, QI output and optionally filtered by analog dual-quadrature mixer device 300. Therefore, polyphase filter 200 has only the four inputs 1 to 4. The four inputs 1 to 4 of multistage analog polyphase filter 200 are connected to outputs (1 . . . 4) of adder-amplifier device 400. In each case, two outputs of multistage polyphase filter 200 are short-circuited with one another.

The circuit according to FIG. 2 has the particular advantage that the inputs of analog adder-amplifier device 400 have a high input impedance, so that the eight inputs of analog adder-amplifier device 400 do not represent a signal short-circuit for the output signals II, –II, QQ, –QQ, IQ, –QI, –IQ, QI of analog dual-quadrature mixer device 300. The surprising effect is achieved in this way that in each case two of these signals II, –II, QQ, –QQ, IQ, –QI, –IQ, QI can be added further ahead in the signal path. Multistage polyphase filter 200 therefore requires only four inputs 1 to 4, so that the chip area required for multistage polyphase filter 200 can be reduced almost by half.

Figure 3:
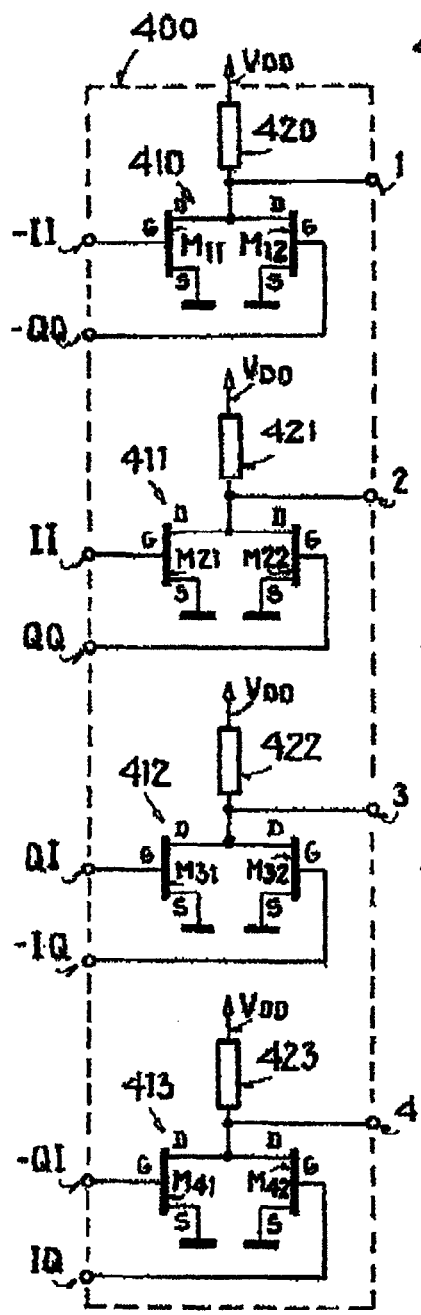
FIG. 3 shows a first exemplary embodiment of an adder-amplifier device.
Figure 4:
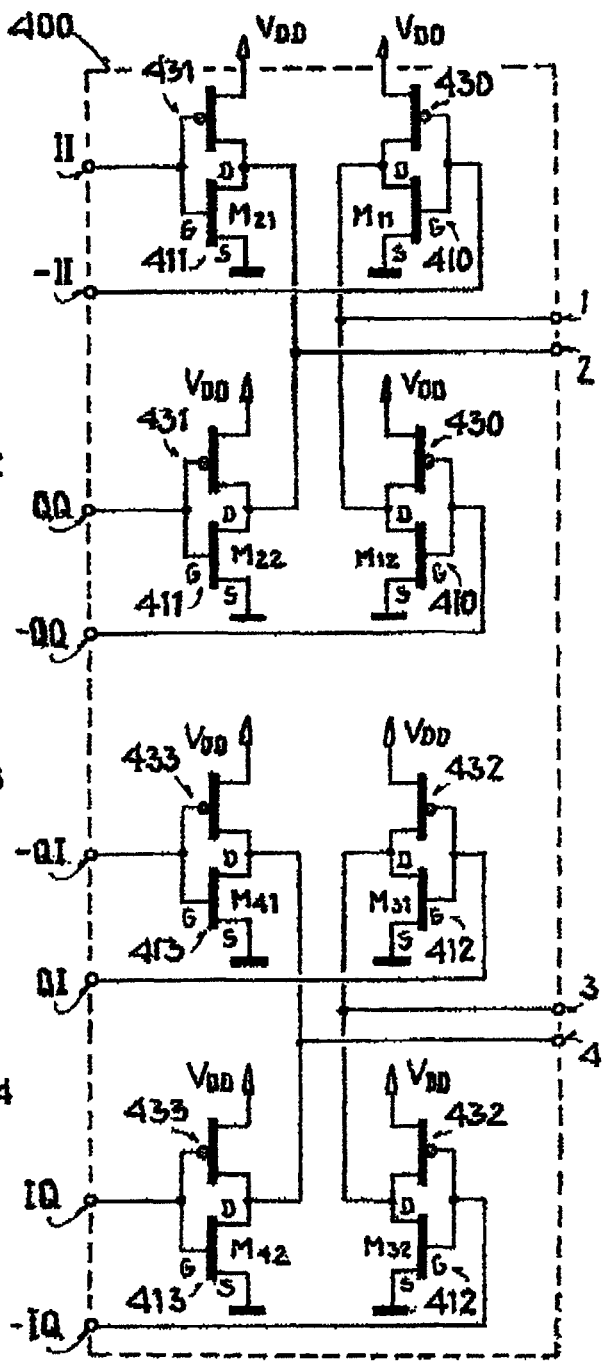
FIG. 4 shows a second exemplary embodiment of an adder-amplifier device.

Two exemplary embodiments of an analog adder-amplifier device 400 are shown in FIGS. 3 and 4. Analog adder-amplifier device 400 according to FIG. 3 has a number of transistor pairs 410, 411, 412, 413. In the exemplary embodiment of FIG. 3, NMOS transistors M11, M12, M21, M22, M31, M32, M41, M42 are interconnected in a source circuit, so that the drain terminals D of each transistor pair 410, 411, 412, 413 are connected to one another and to a load resistor 420, 421, 422, 423. The source terminals S are connected to ground. Alternatively, other circuit types may be used, such as a drain circuit, a gate circuit, or a cascode circuit, or other transistors, such as bipolar transistors.

Both transistors M11, M12, M21, M22, M31, M32, M41, M42 of each transistor pair 410, 411, 412, 413 are connected to the same load resistor 420, 421, 422, 423 for the addition of the signals II, –II, QQ, –QQ, IQ, –QI, –IQ, QI applied at the control inputs G of both transistors M11, M12, M21, M22, M31, M32, M41, M42. In this regard, the control inputs G of transistors M11, M12, M21, M22, M31, M32, M41, M42 are connected downstream of the outputs of analog dual-quadrature mixer device 300. The exemplary embodiment of FIG. 3 has the advantage that the structures of analog adder-amplifier device 400 can be integrated especially easily in a layout of the circuit and moreover require little chip area. Instead of load resistors 420, 421, 422, 423, the load can also be formed by the connected polyphase filter 200 itself, so that analog adder-amplifier device 400 would have current outputs.

Another exemplary embodiment for analog adder-amplifier device 400 is shown in FIG. 4. The load in the exemplary embodiment of FIG. 4 is formed actively by PMOS transistor pairs 430, 431, 432, 433, whereby in each case an NMOS transistor M11, M12, M21, M22, M31, M32, M41, M42 and a PMOS transistor form a push-pull stage. The PMOS transistors, as shown in the exemplary embodiment of FIG. 4, are connected to the supply voltage VDD or alternatively to a current source. Instead of the PMOS transistors, current sources may also be provided as the active load.

The invention is not limited to the shown embodiment variants of FIGS. 1a through 4. For example, it is possible to provide another design of adder-amplifier device 400, whereby the adder-amplifier device must have at least the functions of addition and amplification of the analog input signal. The functionality of the circuit according to FIG. 2 is used especially advantageously for a radio system.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit for image frequency rejection, the circuit comprising:
an analog dual-quadrature mixer device having signal inputs for an in-phase signal and a quadrature-phase signal that are connectable to an input circuit in a signal path, the analog dual quadrature mixer device having oscillator inputs for an in-phase oscillator signal and a quadrature-phase oscillator signal that are connectable to a local oscillator device;
an analog adder-amplifier device having a plurality of transistor pairs, both transistors of each transistor pair being connectable to the same load resistor for the addition of the in-phase signal and the quadrature-phase signal applied at control inputs of both transistors, the control inputs of both transistors being connectable downstream of the outputs of the analog dual-quadrature mixer device; and
a multistage analog polyphase filter having inputs that are connectable to outputs of the adder-amplifier device.

2. The circuit according to claim 1, wherein a load is formed by passive components.

3. The circuit according to claim 1, wherein a load is formed by components of the multistage analog polyphase filter.

4. The circuit according to claim 1, wherein a load is formed by active components.

5. The circuit according to claim 4, wherein the active load is formed from two complementary transistors, wherein a transistor of the transistor pair and a complementary transistor together form a push-pull stage.

6. The circuit according to claim 1, further comprising a further analog polyphase filter, which is connectable to the outputs of the analog dual-quadrature mixer device and to the inputs of the analog adder-amplifier device.

7. The circuit according to claim 1, wherein one or more of the polyphase filter, the dual-quadrature mixer device, and the adder-amplifier device are formed differentially.

8. The circuit according to claim 1, wherein the dual-quadrature mixer device has at least one passive mixer.

9. A method for image frequency rejection, the method comprising:
downmixing or upmixing, in an analog dual-quadrature mixer device, an in-phase signal and a quadrature-phase signal by an in-phase oscillator signal and a quadrature-phase oscillator signal of a local oscillator device to output signals;
adding and amplifying, in each case, two of the signals into sum signals by an adder-amplifier device having a plurality of transistor pairs, both transistors of each transistor pair being connectable to the same load resistor for the addition of the in-phase signal and the quadrature-phase signal applied at control inputs of both transistors, the control inputs of both transistors being connectable downstream of the outputs of the analog dual-quadrature mixer device; and
filtering the sum signals by a multistage analog polyphase filter.

10. The method of claim 9, further comprising forming a load by passive components.

11. The method of claim 9, further comprising forming a load by passive by components of the multistage analog polyphase filter.

12. The method of claim 9, further comprising forming a load by active components.

13. The method of claim 9, wherein the active load is formed from two complementary transistors, wherein a transistor of the transistor pair and a complementary transistor together form a push-pull stage.

14. The method of claim 9, further comprising coupling a further analog polyphase filter to the outputs of the analog dual-quadrature mixer device and to the inputs of the analog adder-amplifier device.

15. The method of claim 9, wherein one or more of the polyphase filter, the dual-quadrature mixer device, and the adder-amplifier device are formed differentially.

16. The method of claim 9, wherein the dual-quadrature mixer device has at least one passive mixer.

17. A circuit for image frequency rejection, the circuit comprising:
an analog dual-quadrature mixer device having differential signal inputs for an in-phase signal and a quadrature-phase signal that are connectable to an input circuit in a signal path, the analog dual quadrature mixer device having differential oscillator inputs for an in-phase oscillator signal and a quadrature-phase oscillator signal that are connectable to a local oscillator device;
an analog adder-amplifier device configured to provide, via addition of eight output signals of the analog dual-quadrature mixer device, four summed signals at four outputs; and
a multistage analog polyphase filter having inputs that are connectable to the outputs of the analog adder-amplifier device.

* * * * *